(12) United States Patent
Sandberg et al.

(10) Patent No.: US 11,552,728 B2
(45) Date of Patent: *Jan. 10, 2023

(54) CODE BLOCK SEGMENTATION FOR NEW RADIO

(71) Applicant: TELEFONAKTIEBOLAGET LM ERICSSON (PUBL), Stockholm (SE)

(72) Inventors: Sara Sandberg, Luleå (SE); Mattias Andersson, Sundbyberg (SE); Yufei Blankenship, Kildeer, IL (US); Amirpasha Shirazinia, Stockholm (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 21 days.

This patent is subject to a terminal disclaimer.

(21) Appl. No.: 17/115,346

(22) Filed: Dec. 8, 2020

(65) Prior Publication Data

US 2021/0091883 A1  Mar. 25, 2021

Related U.S. Application Data

(63) Continuation of application No. 16/705,048, filed on Dec. 5, 2019, now Pat. No. 10,897,323, which is a continuation of application No. 16/368,823, filed on Mar. 28, 2019, now Pat. No. 10,511,408, which is a continuation of application No. PCT/IB2018/056369, filed on Aug. 22, 2018.

(Continued)

(51) Int. Cl.
*H04L 1/00* (2006.01)
*H03M 13/11* (2006.01)
*H03M 13/00* (2006.01)

(52) U.S. Cl.
CPC ......... *H04L 1/0036* (2013.01); *H03M 13/116* (2013.01); *H03M 13/6516* (2013.01);
(Continued)

(58) Field of Classification Search
CPC ........... H04M 13/116; H04M 13/6306; H04M 13/635; H04M 13/6516; H04L 1/00;
(Continued)

(56) References Cited

U.S. PATENT DOCUMENTS 9,094,043 B2  7/2015  Shinohara et al.
10,432,219 B2  10/2019  Zheng et al.
(Continued)

FOREIGN PATENT DOCUMENTS

EP  3123802 B1  10/2018
RU  2574822 C2  2/2016
(Continued)

OTHER PUBLICATIONS

Interdigital Inc., "LDPC Base Graph Determination and Signaling", 3GPP TSG RAN WG1 Meeting 91, Reno, USA, Nov. 27-Dec. 1, 2017, pp. 1-2, R1-1720642, 3GPP.
(Continued)

*Primary Examiner* — Khaled M Kassim
*Assistant Examiner* — Kai Chang

(57) ABSTRACT

Methods, systems, and apparatus are provided for encoding code blocks for transmission in a wireless communication system. An example encoding method in a wireless communication system includes determining, for one or more code blocks of a transport block, that at least one of a plurality of criteria is met, wherein the plurality of criteria includes that a coding rate (R) is less than or equal to ¼ or that a transport block size (TBS) is less than or equal to 3824 bits and the R is less than or equal to ⅔. The one or more code blocks are encoded using low-density parity-check (LDPC) base graph 2, wherein a maximum code block size is 3840 bits. The one or more encoded code blocks are transmitted over the wireless network.

20 Claims, 10 Drawing Sheets

Related U.S. Application Data

(60) Provisional application No. 62/549,897, filed on Aug. 24, 2017.

(52) U.S. Cl.
CPC .......... *H04L 1/0003* (2013.01); *H04L 1/0013* (2013.01); *H04L 1/0057* (2013.01); *H04L 1/0067* (2013.01); *H03M 13/635* (2013.01); *H03M 13/6306* (2013.01); *H04L 1/00* (2013.01)

(58) Field of Classification Search
CPC ... H04L 1/0003; H04L 1/0013; H04L 1/0036; H04L 1/0057; H04L 1/0067
See application file for complete search history.

(56) References Cited

U.S. PATENT DOCUMENTS

| | | | |
|---|---|---|---|
| 2009/0185638 | A1 | 7/2009 | Imamura et al. |
| 2011/0090948 | A1* | 4/2011 | Zhou ................ H04L 1/0009 375/E7.026 |
| 2014/0068375 | A1* | 3/2014 | Eroz ................ H04L 1/0068 714/763 |
| 2014/0153484 | A1 | 6/2014 | Kim et al. |
| 2015/0131611 | A1 | 5/2015 | Pi et al. |
| 2015/0333879 | A1 | 11/2015 | Yang et al. |
| 2015/0381209 | A1 | 12/2015 | Roh et al. |
| 2016/0218750 | A1* | 7/2016 | Ma ................ H03M 13/611 |
| 2016/0227522 | A1 | 8/2016 | Dinan |
| 2017/0126378 | A1 | 5/2017 | Luo et al. |
| 2017/0149528 | A1 | 5/2017 | Kim et al. |
| 2017/0230138 | A1 | 8/2017 | Xiong et al. |
| 2017/0271718 | A1 | 9/2017 | Jang et al. |
| 2017/0331494 | A1 | 11/2017 | Richardson et al. |
| 2017/0332413 | A1 | 11/2017 | Pelletier et al. |
| 2018/0110057 | A1 | 4/2018 | Park et al. |
| 2018/0131391 | A1 | 5/2018 | Kudekar et al. |
| 2018/0132282 | A1 | 5/2018 | Ly et al. |
| 2018/0205497 | A1 | 7/2018 | Wang et al. |
| 2018/0226988 | A1 | 8/2018 | Soriaga et al. |
| 2018/0278267 | A1 | 9/2018 | Lee et al. |
| 2018/0324864 | A1 | 11/2018 | Jung et al. |
| 2018/0368189 | A1 | 12/2018 | Narasimha et al. |
| 2019/0007170 | A1 | 1/2019 | Sun et al. |
| 2019/0013900 | A1* | 1/2019 | Patel ................ H04L 1/0041 |
| 2019/0013901 | A1 | 1/2019 | Nimbalker et al. |
| 2019/0037437 | A1 | 1/2019 | Sun et al. |
| 2019/0068224 | A1 | 2/2019 | Li et al. |
| 2019/0158221 | A1 | 5/2019 | Sarkis et al. |
| 2019/0207710 | A1 | 7/2019 | Ye et al. |
| 2019/0229861 | A1 | 7/2019 | Yoshimura et al. |
| 2019/0296767 | A1 | 9/2019 | Sandberg et al. |
| 2019/0334652 | A1* | 10/2019 | Myung ................ H03M 13/116 |
| 2020/0153549 | A1* | 5/2020 | Noh ................ H04L 1/0009 |
| 2020/0228239 | A1* | 7/2020 | Wang ................ H04L 1/0067 |
| 2020/0235759 | A1* | 7/2020 | Ye ................ H03M 13/6362 |

FOREIGN PATENT DOCUMENTS

| | | |
|---|---|---|
| WO | 2012036077 A1 | 3/2012 |
| WO | 2013116762 A1 | 8/2013 |
| WO | 2016073104 A1 | 5/2016 |

OTHER PUBLICATIONS

Qualcomm Incorporated, "TBS and Base-graph Determination", 3GPP TSG RAN WG1 Meeting 91, Reno, USA, Nov. 27-Dec. 1, 2017, pp. 1-12, R1-1721479, 3GPP.

Catt, "Base graphs selection for NR LDPC", TSG-RAN WG1 Meeting #90, Prague, Czechia, Aug. 21-25, 2017, pp. 1-4, R1-1712433, 3GPP.

MCC Support, "Final Report of 3GPP TSG RAN WG1 #AH_NR2 v1.0.0 (Qingdao, China, Jun. 27-30, 2017)", TSG-RAN WG1 Meeting #90, Prague, Czech, Aug. 21-25, 2017, pp. 77-78 and 80, R1-1712032, 3GPP.

3rd Generation Partnership Project; Technical Specification Group Radio Access Network; NR; Multiplexing and channel coding (Release 15), 3GPP TS 38.212 V15.0.1 (Feb. 2018).

Ericsson, Code Rate Threshold for BG2 Application, 3GPP TSG RAN WG1 Meeting NR#3, Nagoya, Japan, Sep. 18-21, 2017, R1-1715734.

Ericsson, Design of LDPC Codes for NR, 3GPP TSG RAN WG1 Meeting #87, Reno, USA, Nov. 14-18, 2016, R1-1611321.

Ericsson, et al., Correction of maximum TBS sizes, Change Request 36.213 CR 0050 Version 8.3.0, 3GPP TSG-RAN Meeting #53bis, Warsaw, Poland, Jun. 30-Jul. 4, 2008, R1-082720.

Interdigital Inc., Code Block Segmentation for Data Channel, 3GPP TSG RAN WG1 Meeting #90, Prague, Czech Republic, Aug. 21-25, 2017, R1-1714167.

Interdigital, Inc., On LDPC Base Graph Selection, 3GPP TSG RAN WG1 Meeting #90, Prague, Czech Republic, Aug. 21-25, 2017, R1-1714169.

LG Electronics, Base Graph Selection for LDPC code, 3GPP TSG RAN WG1 #90, Prague, Czech Republic, Aug. 21-25, 2017, R1-1713211.

Mediatek Inc., On design and performance of NR eMBB LDPC Code, 3GPP TSG-RAN WG1 Meeting #89, Hangzhou, CN, May 15-19, 2017, R1-1709856.

Nokia, Rate matching for LDPC, 3GPP TSG RAN WG1 NR Ad-Hoc #2, Qingdao, P.R. China Jun. 27-30, 2017, R1-1711536.

CMCC, "Discussion on RACH configuration", 3GPP TSG RAN WG1 Meeting Ad-hoc#3, Nagoya, Japan, Sep. 18-21, 2017, pp. 1-8, R1-1716046, 3GPP.

Ericsson, "NR four-step random access procedure", 3GPP TSG-RAN WG1 NR adhoc, Spokane, USA, Jan. 16-20, 2017, pp. 1-6, R1-1700299, 3GPP.

Ericsson, "NR PRACH design", 3GPP TSG-RAN WG1 Meeting #89, Hangzhou, China, May 15-19, 2017, pp. 1-13, R1-1708725, 3GPP.

Ericsson, "Summary of discussion on SS block composition, SS burst set composition and SS time index indication", Spokane, USA, Apr. 3-7, 2017, pp. 1-2, R1-1706534, 3GPP.

Interdigital Inc., "On SS Block and Burst Set Design and Indication", 3GPP TSG RAN WG1 Meeting #90, Prague, Czech Republic, Aug. 21-25, 2017, pp. 1-4, R1-1714129, 3GPP.

LG Electronics, "Discussion on RACH Procedure", 3GPP TSG-RAN WG1 Meeting #89, May 15-19, 2017, pp. 1-11, R1-1707594, 3GPP.

Motorola Mobility et al., "Discussion on SS block transmission", 3GPP TSG-RAN WG1#88bis, Spokane, USA, Apr. 3-7, 2017, pp. 1-4, R1-1705549, 3GPP.

Nokia et al., "NR random access procedure", 3GPP TSG-RAN WG1#88bis, Spokane, USA, Apr. 3-7, 2017, pp. 1-10, R1-1704943, 3GPP.

Nokia et al., "Remaining details on PRACH procedure", 3GPP TSG-RAN WG1#NR3, Nagoya, Japan, Sep. 18-21, 2017, pp. 1-12, R1-1716138, 3GPP.

Nokia et al., "Remaining details on SS burst set related procedures", 3GPP TSG-RAN WG1#NR3, Nagoya, Japan, Sep. 18-21, 2017, pp. 1-9, R1-1715908, 3GPP.

Nokia et al., "Transmission in preconfigured UL resources", 3GPP TSG RAN WG1 Meeting #95, Spokane, USA, Nov. 12-16, 2018, p. 1-5, R1-1812929, 3GPP.

Samsung, "4-step RACH procedure discussion", Prague, Czechia, Aug. 22-27, 2017, pp. 1-13, R1-1713562, 3GPP.

* cited by examiner

CODE BLOCK SEGMENTATION FOR NEW RADIO

RELATED APPLICATIONS

This application is a continuation of U.S. application Ser. No. 16/705,048, filed Dec. 5, 2019, which is a continuation of U.S. application Ser. No. 16/368,823 (now U.S. Pat. No. 10,511,408), filed Mar. 28, 2019, which is a continuation of International Application No. PCT/IB2018/056369, filed Aug. 22, 2018, which claims the benefit of U.S. Application No. 62/549,897, filed Aug. 24, 2017, the disclosures of which are fully incorporated herein by reference.

TECHNICAL FIELD

Particular embodiments are directed to wireless communications and, more particularly, to code block segmentation for new radio (NR) base graph number two (BG2).

INTRODUCTION

Third Generation Partnership Project (3GPP) defines a fifth generation (5G) of wireless communication that includes new radio (NR). NR uses two sets of low-density parity check (LDPC) codes. One LDPC code is designed for code rates from ~8/9 to 1/3 and block lengths up to 8448 (base graph #1, also referred to as BG #1 or BG1). The other LDPC code is designed for code rates from ~2/3 to 1/5 and block lengths up to 3840 (base graph #2, also referred to as BG #2 or BG2). When the LDPC codes are used with lower rates than they designed for, repetition and chase combining may be used to achieve a lower code rate.

Base graph #1 is used for the initial transmission and subsequent re-transmissions of the same transport block (TB) when the code block size (CBS) is greater than X or the code rate of the initial transmission is greater than Y. Base graph #2 is used for the initial transmission and subsequent re-transmissions of the same TB when CBS is less than or equal to X and code rate of the initial transmission is less than or equal to Y. X may be equal to 2560 according to the first design criterion or extended to 3840 which is the maximum CBS for which base graph #2 is defined. Y equals 0.67 and may be extended to 0.75.

One proposal under discussion in 3GPP is for code rate R<1/3, the maximum code block size is $K_{cb}$=3840 and BG2 is used. For TB size (TBS) larger than $K_{cb}$, the number of code blocks is determined by segmenting the TB into code blocks no larger than $K_{cb}$=3840.

An alternative way of phrasing this proposal is that BG2 is used for the initial transmission and subsequent re-transmissions of the same TB when CBS<=X and the code rate of the initial transmission<=2/3. BG2 is used for initial transmissions with code rate<1/3 for all TBS.

A problem with the proposal is that BG2 is selected for rates just below 1/3. For the combination of code rate just below 1/3 and TBS>3840, BG1 performs better than BG2 due to the small fraction of repetition used for BG1 and the code block segmentation needed when using BG2. An example is illustrated in FIG. 1.

FIG. 1 is a graph illustrating base graph performance. K indicates the TBS plus any CRC bits added. The dotted curve with squares is the performance using BG2, and the solid line with circles is the performance using BG1.

SUMMARY

The embodiments described herein include, for transport block size (TBS) greater than X (e.g., X=3840), instead of selecting base graph number two (BG2) for any code rate R<1/3, selecting BG2 if R<R_threshold, where R_threshold is in the range 1/5<R_threshold<1/3 (e.g., 1/4).

According to some embodiments, a method for use in a wireless transmitter of encoding a transport block comprises, upon determining a code rate for transmitting a transport block is less than or equal to R_threshold (R_threshold is between 1/5 and 1/3), selecting new radio (NR) low-density parity-check (LDPC) base graph 2 for encoding the transport block. Otherwise, the method comprises selecting NR LDPC base graph 1 for encoding the transport block, unless a TBS of the transport block is less than or equal to a size threshold (X) and a code rate for transmitting the transport block is less than or equal to 2/3, in which case the method may comprise selecting base graph 2. The method further comprises encoding the transport block using the selected base graph and transmitting the encoded transport block to a wireless receiver.

In particular embodiments, the method further comprises determining limited buffer rate matching (LBRM) is used by the wireless receiver and adjusting the code rate according to the LBRM before selecting base graph 1 or base graph 2.

According to some embodiments, a wireless transmitter is operable to encode a transport block. The wireless transmitter comprises processing circuitry operable to, upon determining a code rate for transmitting a transport block is less than or equal to R_threshold (R_threshold is between 1/5 and 1/3), select NR LDPC base graph 2 for encoding the transport block. Otherwise, the processing circuitry selects NR LDPC base graph 1 for encoding the transport block, unless a TBS of the transport block is less than or equal to a size threshold (X) and a code rate for transmitting the transport block is less than or equal to 2/3, in which case the processing circuitry may select base graph 2. The processing circuitry is further operable to encode the transport block using the selected base graph and transmit the encoded transport block to a wireless receiver.

In particular embodiments, the processing circuitry is further operable to determine LBRM is used by the wireless receiver and adjust the code rate according to the LBRM before selecting base graph 1 or base graph 2.

In particular embodiments, R_threshold is 1/4. The size threshold X may be 3824 bits, or when the TBS includes parity check bits the size threshold X may be 3840 bits. The TBS and code rate for the transport block may be determined based on a modulation and coding scheme (MCS) and a TBS index associated with the transport block.

In particular embodiments, the wireless transmitter may comprise a network node or a wireless device, such as a user equipment.

According to some embodiments, a method for use in a wireless receiver of a wireless communication network of decoding a transport block comprises receiving an encoded transport block from a wireless transmitter. Upon determining a code rate for receiving the transport block is less than or equal to R_threshold (R_threshold is between 1/5 and 1/3), the method comprises selecting NR LDPC base graph 2 for decoding the received transport block. Otherwise, the method comprises selecting NR LDPC base graph 1 for decoding the transport block, unless a TBS of the transport block is less than or equal to a size threshold (X) and a code rate for transmitting the transport block is less than or equal to 2/3, in which case the method may comprise selecting base graph 2. The method further comprises decoding the transport block using the selected base graph.

In particular embodiments, the method further comprises determining limited buffer rate matching (LBRM) is used by the wireless receiver and adjusting the code rate according to the LBRM before selecting base graph 1 or base graph 2.

According to some embodiments, a wireless receiver is operable to decode a transport block. The wireless receiver comprises processing circuitry operable to receive an encoded transport block from a wireless transmitter. Upon determining a code rate for receiving the transport block is less than or equal to R_threshold (R_threshold is between $\frac{1}{5}$ and $\frac{1}{3}$), select NR LDPC base graph 2 for decoding the transport block. Otherwise, the processing circuitry is operable to select NR LDPC base graph 1 for decoding the transport block, unless a TBS of the transport block is less than or equal to a size threshold (X) and a code rate for transmitting the transport block is less than or equal to $\frac{2}{3}$, in which case the processing circuitry may select base graph 2. The processing circuitry is further operable to decode the transport block using the selected base graph.

In particular embodiments, the processing circuitry is further operable to determine LBRM is used by the wireless receiver and adjust the code rate according to the LBRM before selecting base graph 1 or base graph 2.

In particular embodiments, R_threshold is $\frac{1}{4}$. The size threshold X may be 3824 bits, or when the TBS includes parity check bits the size threshold X may be 3840 bits. The TBS and code rate for the transport block may be determined based on an MCS and a TBS index associated with the transport block.

In particular embodiments, the wireless receiver may comprise a network node or a wireless device, such as a user equipment.

According to some embodiments, a wireless transmitter is operable to encode a transport block. The wireless transmitter comprises an encoding module and a transmitting module. The encoding module is operable to, upon determining a code rate for transmitting a transport block is less than or equal to R_threshold (R_threshold is between $\frac{1}{5}$ and $\frac{1}{3}$), select NR LDPC base graph 2 for encoding the transport block. Otherwise, the encoding module is operable to select NR LDPC base graph 1 for encoding the transport block, unless a transport block size (TBS) of the transport block is less than or equal to a size threshold (X) and a code rate for transmitting the transport block is less than or equal to $\frac{2}{3}$. The encoding module is further operable to encode the transport block using the selected base graph. The transmitting module is operable to transmit the encoded transport block to a wireless receiver.

According to some embodiments, a wireless receiver is operable to decode a transport block. The wireless receiver comprises a decoding module and a receiving module. The receiving module is operable to receive an encoded transport block from a wireless transmitter. The decoding module is operable to, upon determining a code rate for receiving the transport block is less than or equal to R_threshold (R_threshold is between $\frac{1}{5}$ and $\frac{1}{3}$), select NR LDPC base graph 2 for decoding the transport block. Otherwise, the decoding module is operable to select NR LDPC base graph 1 for decoding the transport block, unless a TBS of the transport block is less than or equal to a size threshold (X) and a code rate for transmitting the transport block is less than or equal to $\frac{2}{3}$. The decoding module is further operable to decode the transport block using the selected base graph.

Also disclosed is a computer program product. The computer program product comprises instructions stored on non-transient computer-readable media which, when executed by a processor, perform the step of, upon determining a code rate for transmitting a transport block is less than or equal to R_threshold (R_threshold is between $\frac{1}{5}$ and $\frac{1}{3}$), selecting NR LDPC base graph 2 for encoding the transport block. Otherwise, the instructions perform the step of selecting NR LDPC base graph 1 for encoding the transport block, unless a TBS of the transport block is less than or equal to a size threshold (X) and a code rate for transmitting the transport block is less than or equal to $\frac{2}{3}$, in which case the instructions may perform the step of selecting base graph 2. The instructions are further operable to perform the steps of encoding the transport block using the selected base graph and transmitting the encoded transport block to a wireless receiver.

Another computer program product comprises instructions stored on non-transient computer-readable media which, when executed by a processor, perform the step of receiving an encoded transport block from a wireless transmitter. Upon determining a code rate for receiving the transport block is less than or equal to R_threshold (R_threshold is between $\frac{1}{5}$ and $\frac{1}{3}$), the instructions perform the step of selecting NR LDPC base graph 2 for decoding the received transport block. Otherwise, the instructions perform the step of selecting NR LDPC base graph 1 for decoding the transport block, unless a TBS of the transport block is less than or equal to a size threshold (X) and a code rate for transmitting the transport block is less than or equal to $\frac{2}{3}$, in which case the instructions may perform the step of selecting base graph 2. The instructions further perform the step of decoding the transport block using the selected base graph.

Particular embodiments may include some, all, or none of the following advantages. For example, by avoiding using BG2 for code rates just below $\frac{1}{3}$, there is enough coding gain due to the lower design rate of BG2 to make up for the losses due to additional code block segmentation and worse performance because of shorter code block lengths. With an optimized R_threshold (can be optimized through simulations), it is possible to avoid using BG2 for the specific cases of code rate and block length where BG1 has better performance, and only use BG2 for the cases where there is a significant performance gain.

BRIEF DESCRIPTION OF THE DRAWINGS

For a more complete understanding of the embodiments and their features and advantages, reference is now made to the following description, taken in conjunction with the accompanying drawings, in which.

DETAILED DESCRIPTION

Figure 1:
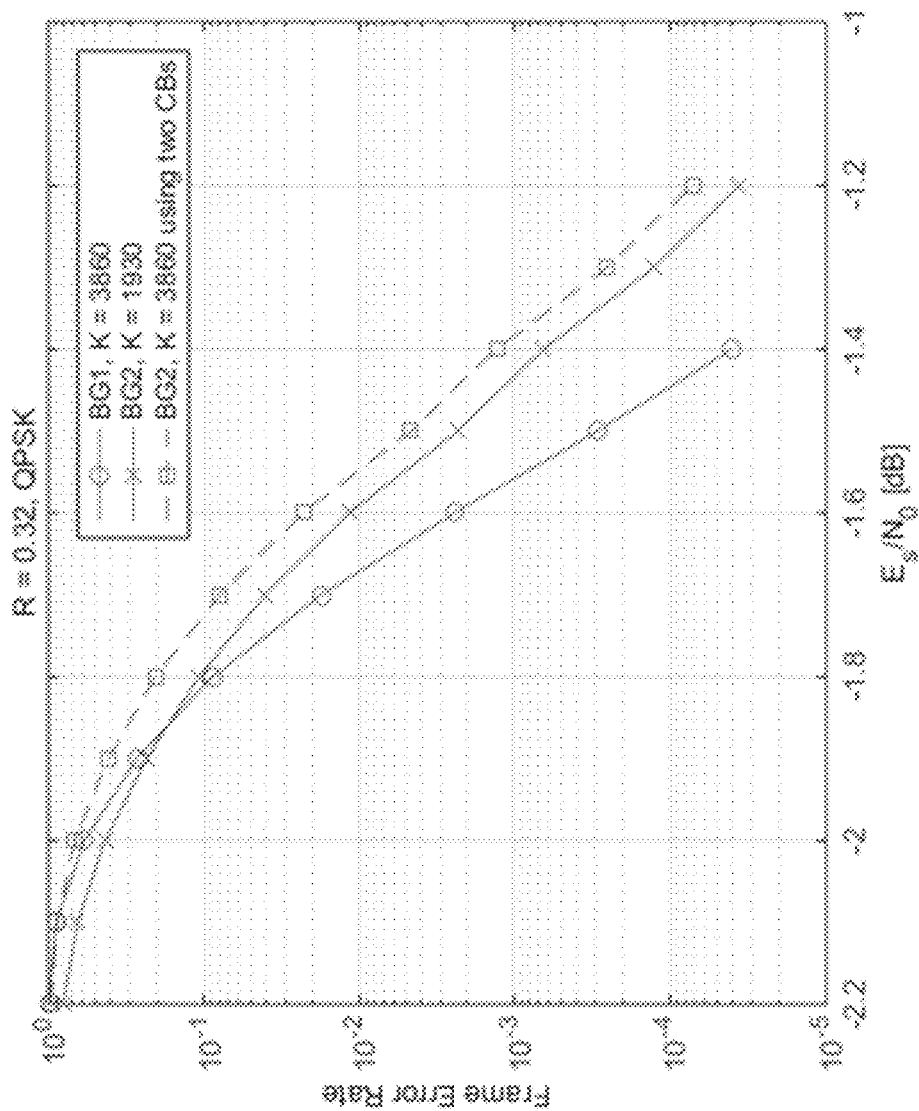
FIG. 1 is a graph illustrating base graph performance.

Third Generation Partnership Project (3GPP) defines a fifth generation (5G) of wireless communication that includes new radio (NR). NR uses two sets of low-density parity check (LDPC) codes. One LDPC code is designed for code rates from ~8/9 to 1/3 and block lengths up to 8448 (base graph #1, also referred to as BG #1 or BG1). The other LDPC code is designed for code rates from ~2/3 to 1/5 and block lengths up to 3840 (base graph #2, also referred to as BG #2 or BG2). When the LDPC codes are used with lower rates than they are designed for, repetition and chase combining may be used to achieve a lower code rate.

One proposal under discussion in 3GPP is for code rate R<1/3 BG2 is used because of its lower design code rate and the maximum code block size is thereby $K_{cb}$=3840. For transport block size (TBS) larger than $K_{cb}$, the number of code blocks is determined by segmenting the transport block into code blocks no larger than $K_{cb}$=3840.

A problem with the proposal is that BG2 is selected for rates just below 1/3. For the combination of code rate just below 1/3 and TBS>3840, BG1 performs better than BG2 because of the small fraction of repetition used for BG1 and the code block segmentation needed when using BG2.

The embodiments described herein obviate the problems described above and include, for TBS greater than X (e.g., X=3840), instead of selecting BG2 for any code rate R<1/3, selecting BG2 if R<R_threshold, where R_threshold is in the range 1/5<R_threshold<1/3 (e.g., 1/4). By avoiding using BG2 for code rates just below 1/3, there is enough coding gain because of the lower design rate of BG2 to make up for the losses from additional code block segmentation and worse performance because of shorter code block lengths. With an optimized R_threshold (can be optimized through simulations (e.g., 1/4)), it is possible to avoid using BG2 for the specific cases of code rate and block length where BG1 has better performance, and only use BG2 for the cases where there is a significant performance gain.

The following description sets forth numerous specific details. It is understood, however, that embodiments may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments, whether or not explicitly described.

Particular embodiments are described with reference to FIGS. 2-10B of the drawings, like numerals being used for like and corresponding parts of the various drawings. LTE and NR are used throughout this disclosure as an example cellular system, but the ideas presented herein may apply to other wireless communication systems as well.

Figure 2:
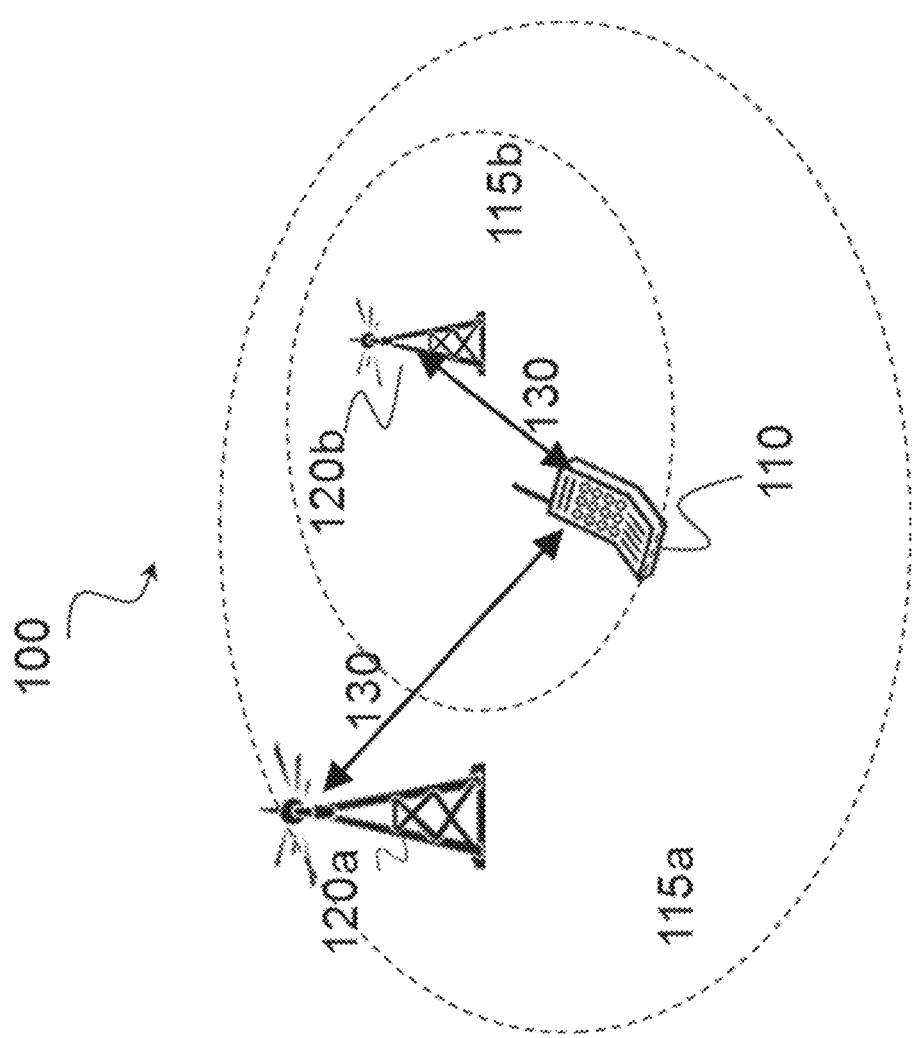
FIG. 2 is a block diagram illustrating an example wireless network, according to a particular embodiment.

FIG. 2 is a block diagram illustrating an example wireless network, according to a particular embodiment. Wireless network 100 includes one or more wireless devices 110 (such as mobile phones, smart phones, laptop computers, tablet computers, MTC devices, or any other devices that can provide wireless communication) and a plurality of network nodes 120 (such as base stations, eNodeBs, gNBs, etc.). Wireless device 110 may also be referred to as a UE. Network node 120 serves coverage area 115 (also referred to as cell 115).

In general, wireless devices 110 that are within coverage of network node 120 (e.g., within cell 115 served by network node 120) communicate with network node 120 by transmitting and receiving wireless signals 130. For example, wireless devices 110 and network node 120 may communicate wireless signals 130 containing voice traffic, data traffic, and/or control signals. A network node 120 communicating voice traffic, data traffic, and/or control signals to wireless device 110 may be referred to as a serving network node 120 for the wireless device 110. Communication between wireless device 110 and network node 120 may be referred to as cellular communication. Wireless signals 130 may include both downlink transmissions (from network node 120 to wireless devices 110) and uplink transmissions (from wireless devices 110 to network node 120).

Each network node 120 may have a single transmitter or multiple transmitters for transmitting signals 130 to wireless devices 110. In some embodiments, network node 120 may comprise a multi-input multi-output (MIMO) system. Wireless signal 130 may comprise one or more beams. Particular beams may be beamformed in a particular direction. Each wireless device 110 may have a single receiver or multiple receivers for receiving signals 130 from network nodes 120 or other wireless devices 110. Wireless device 110 may receive one or more beams comprising wireless signal 130.

Wireless signals 130 may be transmitted on time-frequency resources. The time-frequency resources may be partitioned into radio frames, subframes, slots, and/or mini-slots. Network node 120 may dynamically schedule subframes/slots/mini-slots as uplink, downlink, or a combination uplink and downlink. Different wireless signals 130 may comprise different transmission processing times.

Network node 120 may operate in a licensed frequency spectrum, such as an LTE spectrum. Network node 120 may also operate in an unlicensed frequency spectrum, such as a 5 GHz Wi-Fi spectrum. In an unlicensed frequency spectrum, network node 120 may coexist with other devices such as IEEE 802.11 access points and terminals. To share the unlicensed spectrum, network node 120 may perform listen-before talk (LBT) protocols before transmitting or receiving wireless signals 130. Wireless device 110 may also operate in one or both of licensed or unlicensed spectrum and in some embodiments may also perform LBT protocols before transmitting wireless signals 130. Both network node 120 and wireless device 110 may also operate in licensed shared spectrum.

For example, network node 120a may operate in a licensed spectrum and network node 120b may operate in an unlicensed spectrum. Wireless device 110 may operate in both licensed and unlicensed spectrum. In particular embodiments, network nodes 120a and 120b may be configurable to operate in a licensed spectrum, an unlicensed spectrum, a licensed shared spectrum, or any combination. Although the coverage area of cell 115b is illustrated as included in the coverage area of cell 115a, in particular embodiments the coverage areas of cells 115a and 115b may overlap partially or may not overlap at all.

In particular embodiments, wireless device 110 and network nodes 120 may perform carrier aggregation. For example, network node 120a may serve wireless device 110 as a PCell and network node 120b may serve wireless device 110 as a SCell. Network nodes 120 may perform self-scheduling or cross-scheduling. If network node 120a is operating in licensed spectrum and network node 120b is operating in unlicensed spectrum, network node 120a may provide license assisted access to the unlicensed spectrum (i.e., network node 120a is a LAA PCell and network node 120b is a LAA SCell).

In particular embodiments, wireless signals 130 may be encoded using low-density parity check (LDPC) codes. One of two base graphs may be chosen for encoding and decoding wireless signals 130. Wireless device 110 or network node 120 may choose the base graph according to any of the embodiments or examples described below. Selection of base graphs is described in more detail below with respect to FIGS. 3-8.

In wireless network 100, each network node 120 may use any suitable radio access technology, such as long term evolution (LTE), LTE-Advanced, UMTS, HSPA, GSM, cdma2000, NR, WiMax, WiFi, and/or other suitable radio access technology. Wireless network 100 may include any suitable combination of one or more radio access technologies. For purposes of example, various embodiments may be described within the context of certain radio access technologies. However, the scope of the disclosure is not limited to the examples and other embodiments could use different radio access technologies.

As described above, embodiments of a wireless network may include one or more wireless devices and one or more different types of radio network nodes capable of communicating with the wireless devices. The network may also include any additional elements suitable to support communication between wireless devices or between a wireless device and another communication device (such as a landline telephone). A wireless device may include any suitable combination of hardware and/or software. For example, in particular embodiments, a wireless device, such as wireless device 110, may include the components described with respect to FIG. 9A below. Similarly, a network node may include any suitable combination of hardware and/or software. For example, in particular embodiments, a network node, such as network node 120, may include the components described with respect to FIG. 10A below.

As described above, the maximum information block length of BG1 is Kmax1=8448. The maximum information block length of BG2 is Kmax2=3840.

If BG1 is used to transmit a long transport block (TB), the transport block and any filler bits and CRC bits that may be added, are divided into code blocks (CBs) of size 8448 or less. If BG2 is used, the TB is divided into CBs of size 3840 or less.

Using BG2 for low code rates can be advantageous because BG2 is designed for a lower minimum code rate than BG1. BG2 uses code extension down to a code rate Rmin2=⅕, while BG1 only has code extension down to Rmin1=⅓. For a transmission with R=⅕, a significant coding gain may be realized by using BG2 instead of BG1.

At least two problems exist, however, with doing code block segmentation using BG2 that has a smaller maximum information block length. (1) The performance for shorter block lengths is worse than for longer block lengths. (2) If smaller code blocks are used, the number of code blocks used for transmission of one transport block increases. Under the assumption that the transmission of each code is an independent event, the block error rate (BLER) for the transport block can be calculated as BLER(TB)=1−(1−BLER for one CB)^N, where N is the number of code blocks that the transport block is divided into.

In addition to problems 1 and 2, the total number of cyclic redundancy check (CRC) bits that are attached to code blocks may increase when using BG2. This is because the number of code blocks may increase and the same number of CRC bits are attached to each code block independent of code block size. The impact of the extra CRC bits in terms of performance is, however, minor compared to problems 1 and 2, and is therefore neglected in the following discussion and examples.

Simulations show the impact of both the advantage from the coding gain by code extension as well as the drawbacks 1) and 2) above. Example 1 below refers to a scenario where the current proposal of performing code block segmentation using BG2 if the code rate of the initial transmission is less than ⅓ actually gives a performance loss. The results are illustrated in FIG. 3.

Figure 3:
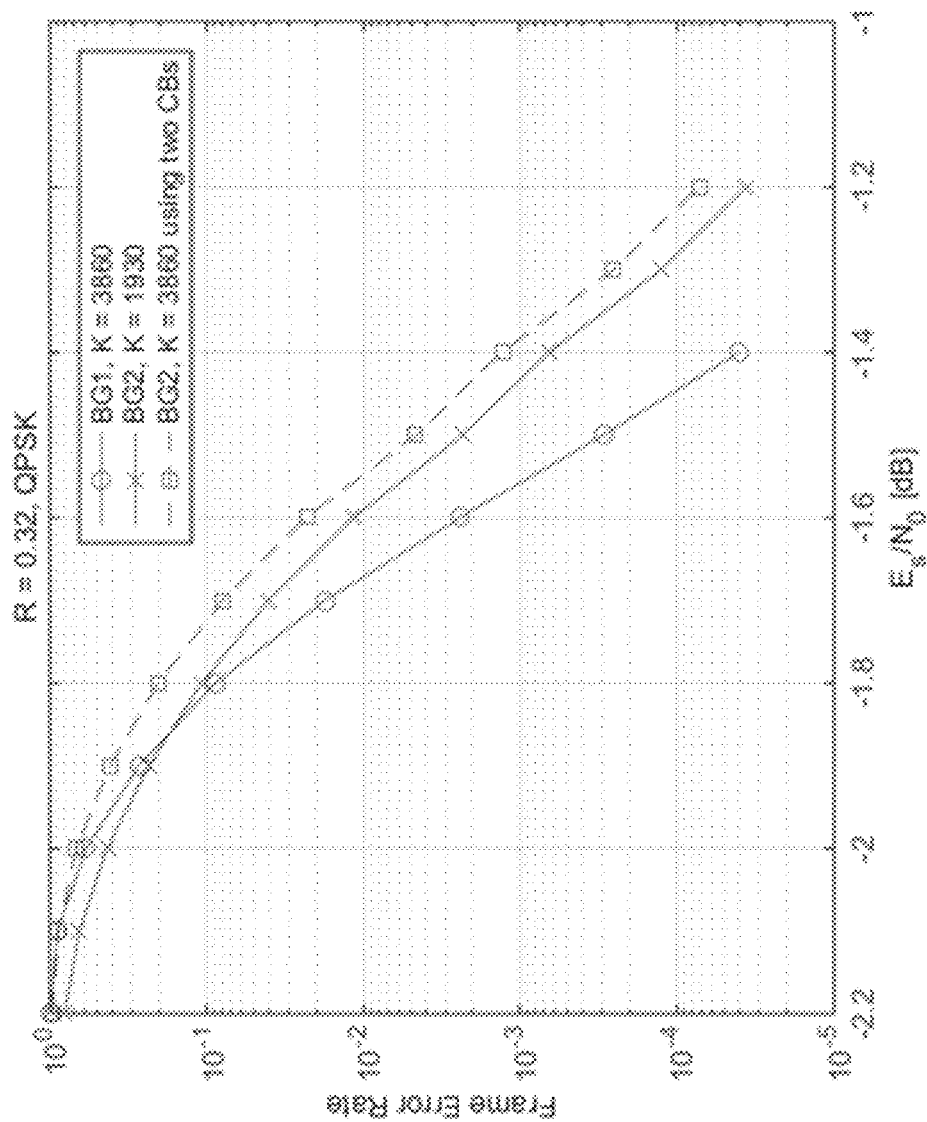
FIGS. 3-5 are graphs illustrating base graph performance, according to some embodiments.

FIG. 3 is a graph illustrating base graph performance comparison between BG1 and BG2 for TBS=3860 and R=0.32, according to some embodiments. In Example 1, K equals 3860 and R equals 0.32. The graph illustrates BLER for BG1 with K=3860 and R=0.32; and BLER for BG2 with K=3860/2 and R=0.32. BLER for the concatenation of two code blocks with K=1930 to achieve K=3860 is calculated by BLER(two CBs)=1−(1−BLER(one CB))^2 where BLER (one CB) is given by 2). BLER(two CBs) is the same as BLER(TB) in this case, where the TB is 3860.

Comparing 1) to 3) shows a performance loss of using BG2 by around 0.1 dB at 10% BLER. At BLER 10^−4, the performance loss is ~0.22 dB.

It is not only for TBS just above Kmax2 where the TBS must be segmented into two short code blocks that this problem occurs. Another case with TBS=7800 and R=0.32 is shown in Example 2. The results are illustrated in FIG. 4.

Figure 4:
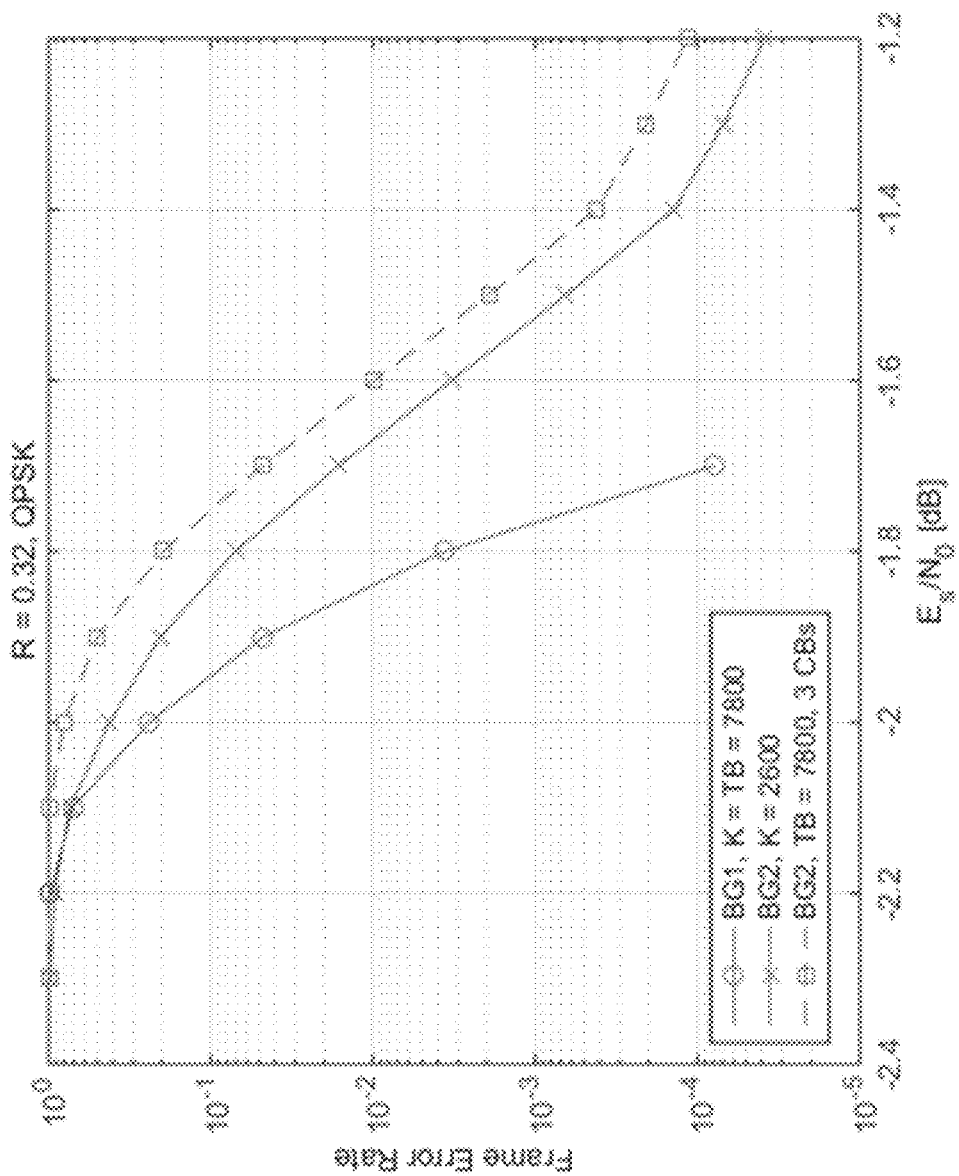

FIG. 4 is a graph illustrating base graph performance comparison between BG1 and BG2 for TBS=7800 and R=0.32, according to some embodiments. In Example 1, TBS equals 7800 and R equals 0.32. The graph illustrates BLER for BG1 with K=TBS=7800 and R=0.32; and BLER for BG2 with K=7800/3=2600 and R=0.32. BLER for the concatenation of three code blocks with K=2600 to achieve TBS=7800 is calculated by BLER(TB)=1−(1−BLER(one CB))^3 where BLER(one CB) is given by 2).

Comparing 1) to 3) shows a performance loss of using BG2 by around 0.24 dB at 1% BLER. At BLER 10^−4, the performance loss is ~0.5 dB.

Other scenarios, however, may achieve a large gain by performing code block segmentation using BG2 instead of BG1, such as in Example 3. The results of Example 3 are illustrated in FIG. 5.

Figure 5:
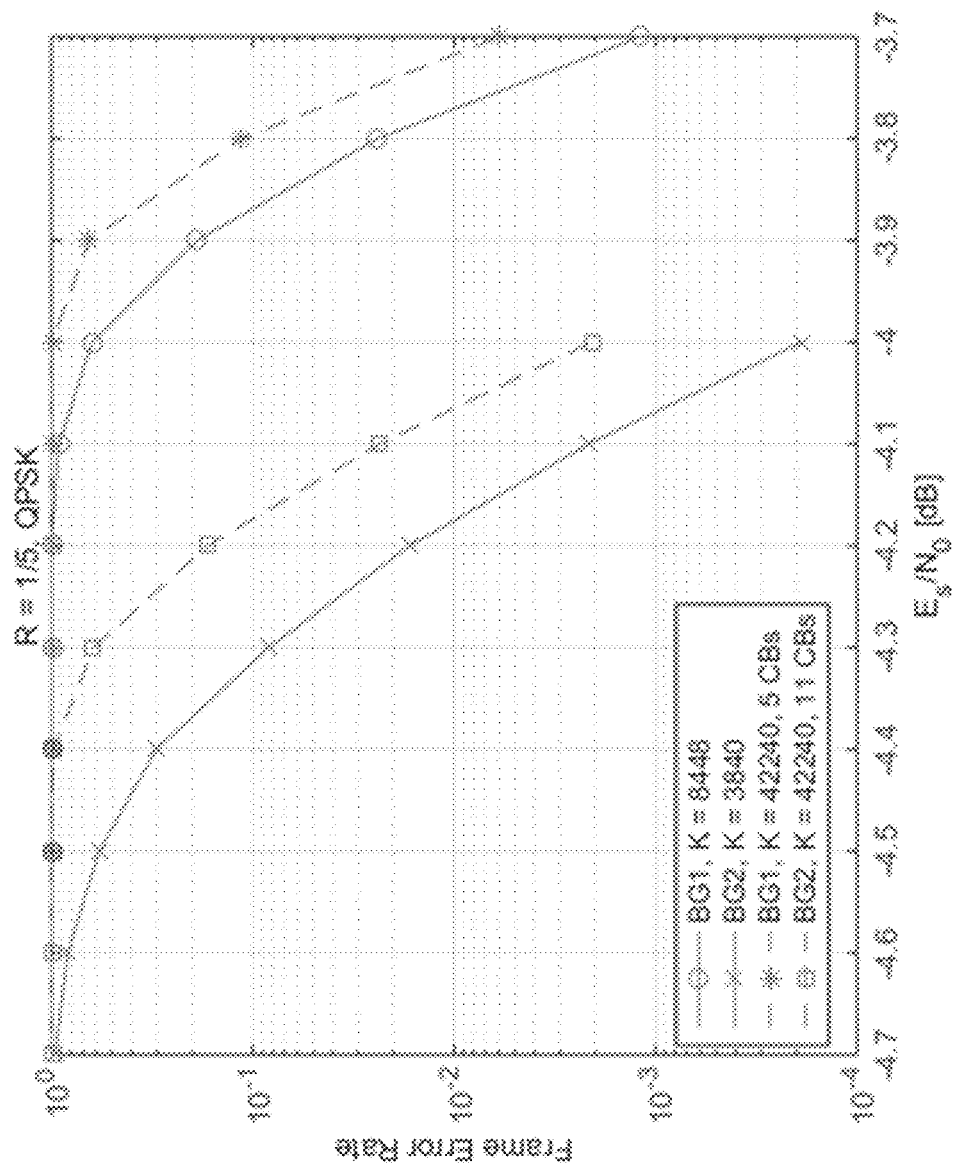

FIG. 5 is a graph illustrating base graph performance comparison between BG1 and BG2 for TBS=42240 and R=0.1/5, according to some embodiments. In Example 3, TBS equals 42240 and R=⅕. The graph illustrates BLER for BG1 with K=8448 and R=⅕ (repetition after R=⅓); and BLER for BG2 with K=3840 and R=⅕. For BG1, 5 CBs are needed. The plots include BLER(five CBs)=1−(1−BLER (one CB))^5 where BLER(one CB) is given by 1). For BG2, 11 CBs are needed. The plots include BLER(11 CBs)=1−(1−BLER(one CB))^11 where BLER(one CB) is given by 2). Comparing 3) to 4) shows a performance gain of around 0.38 dB at 10% BLER.

To take advantage of the large performance gains for some cases while avoiding the losses for other cases, particular embodiments include a modified rule for switching between BG1 and BG2. In a first group of embodiments, BG1 is used for the initial transmission and subsequent re-transmissions of the same transport block when CBS>X or code rate of the initial transmission>Y or TBS>X and code rate of the initial transmission>=R_threshold. BG2 is used for the initial transmission and subsequent re-transmissions of the same TB when CBS<=X and code rate of the initial transmission<=Y or code rate of the initial transmission<R_threshold. R_threshold takes a value between ⅓ and ⅕, typical value is R_threshold=¼.

The code rate of the initial transmission may, for example, be the code rate signaled through downlink control information (DCI). Because code block size depends on transport block size, the above switching rule may be written using only transport block size and not code block size. For example, BG1 is used for the initial transmission and subsequent re-transmissions of the same transport block when code rate of the initial transmission>Y or TBS>X and code rate of the initial transmission>=R_threshold. BG2 is used for the initial transmission and subsequent re-transmissions of the same transport block when TBS<=X and code rate of the initial transmission<=Y or code rate of the initial transmission<R_threshold. An example is illustrated in FIG. 6.

Figure 6:
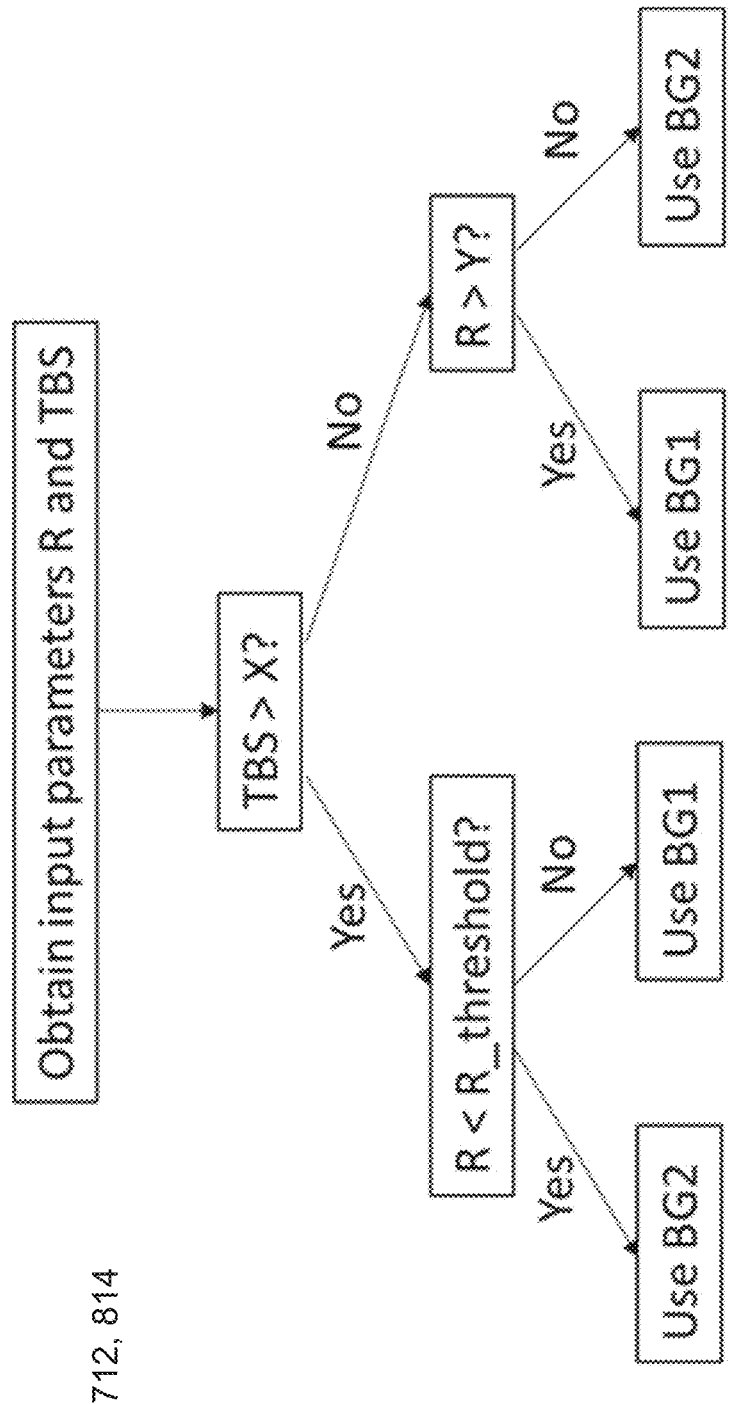
FIG. 6 is a flow diagram illustrating an example method for selecting a base graph, according to particular embodiments.

FIG. 6 is a flow diagram illustrating an example method of selecting a base graph, according to particular embodiments. The block diagram illustrates the method described in the first group of embodiments above. For example, if TBS is greater than a threshold size X (e.g., 3840 bits), then the coding rate R is compared to a coding rate threshold R_threshold (e.g., ¼). If the coding rate R is less than the coding rate threshold R_threshold, then base graph 2 is used, otherwise base graph 1 is used.

If TBS is less than or equal to the threshold size X, then the coding rate is compared to coding rate threshold Y (e.g., ⅔). If the coding rate is greater than the threshold Y, then base graph 1 is used, otherwise base graph 2 is used.

In a second group of embodiments, the selection of base graph accounts for the additional number of code blocks needed when BG2 is used by adding a transport block size restriction to the base graph selection rule. For example, BG1 is used for the initial transmission and subsequent re-transmissions of the same transport block when CBS>X or code rate of the initial transmission>Y or TBS>Z and code rate of the initial transmission>R_threshold. BG2 is used for the initial transmission and subsequent re-transmissions of the same transport block when CBS<=X and code rate of the initial transmission<=Y or code rate of the initial transmission<=R_threshold. R_threshold takes a value between ⅓ and ⅕, typical value is R_threshold=¼, and Z>=X, where X is 3840.

In a third group of embodiments, the above rules for base graph selection can also be formulated as follows. BG1 is used for the initial transmission and subsequent re-transmissions of the same transport block when CBS>X or code rate of the initial transmission>Y OR TBS>Z and code rate of the initial transmission>R_threshold. BG2 is used for all other cases.

In this way, each of the selection rules described in the first and second groups of embodiments can be described in two additional ways, using either the statement for when BG1 is used or the statement for when BG2 is used.

In a fourth group of embodiments, the rule for base graph selection can also be written in terms of MCS and TBS index. The MCS and TBS indices are translated into corresponding TBS and code rate for the initial transmission and the above selection rules can be applied.

In a fifth group of embodiments, instead of formulating rules for base graph selection as described above, a certain base graph can be specified for each MCS index.

In a sixth group of embodiments, instead of specifying a base graph for each MCS index, a rule can be specified to use BG2 if the MCS index is smaller (or larger) than a certain value, otherwise use BG1. Ranges of MCS indices where BG2 is used can also be specified.

In a seventh group of embodiments, a certain base graph can be specified for each combination of MCS index and TBS, where TBS can be specified through a TBS index and number of physical resource blocks (PRB)s in the transmission. A certain base graph can also be specified for combinations of MCS index and a range of TB sizes.

In an eighth group of embodiments, if a formula is used to determine TBS, the selection of BG2 can use the output of the formula as TBS input with any of the above embodiments except where a TBS index is used.

Particular embodiments may include determination of R_threshold. The optimal value of R_threshold, where ⅕<$R_{threshold}$<⅓, may be found through simulations. The simulations may take into account: (a) the performance gain achieved by the lower code rate for which BG2 is designed that gives higher coding gain for BG2 when R<⅓; (b) the performance loss of using BG2 that is due to the shorter code block size; (c) the performance loss of using BG2 that is due to the increased transport block BLER that is the result of dividing a transport block into several code blocks; and (d) the higher number of CRC bits that are needed in total for a transport block if BG2 is used. The same number of CRC bits are added to each code block independent of code block size and if smaller code blocks are used, the number of code blocks and thereby the number of code block CRC bits may increase. For a given transport block size and transmission bandwidth (number of PRBs), a higher number of attached CRC bits may result in the need to use a higher code rate, which in turn leads to a performance loss.

Particular embodiments include base graph selection for limited buffer rate matching (LBRM). For some UE categories, the soft buffer on the receiver side may be limited in size and LBRM is performed. If the soft buffer is limited, the circular buffer on the transmitter side may be limited as well, to make sure that the code rate that the soft buffer on the receiver side can handle is not exceeded in the transmission.

When LBRM is applied, the above methods for base graph selection may be modified. A ninth group of embodiments describes one way of accounting for the limited buffer. Limited buffer size may increase the effective code rate (as seen by LDPC encoder and decoder) above the signaled code rate (as sent in downlink control information from base station to UE).

In the ninth group of embodiments, BG2 is used for initial transmission with code rate R<$R_{threshold}$ for all TBS supported at that code rate, at least when LBRM is not applied. If LBRM is applied, use BG2 if max(R, $R_{LBRM, TBS, BG2}$)<$R_{threshold}$, where $R_{LBRM, TBS, BG2}$ is the smallest rate supported for the TBS when using BG2. $R_{threshold}$<⅓.

The lowest supported LBRM rate may be different for BG1 and BG2 if code block segmentation results in a different number of CBs and thereby attachment of different number of CB CRC bits. $R_{LBRM, TBS, BG1}$=(TBS±$L_{TB,CRC}$+$C_{BG1}*L_{CB,CRC}$)/B. $R_{LBRM, TBS, BG2}$=(TBS+$L_{TB,CRC}$+$C_{BG2}*L_{CB,CRC}$)/B. An approximation is $R_{LBRM, TBS}$=TBS/

B. C is the number of code blocks that the transport block is segmented into, and B is total soft buffer size in bits.

All groups of embodiments 1-7 above may be rewritten to include the updated selection rule "max(R, $R_{LBRM,\ TBS,\ BG2}$)<$R_{threshold}$" and can thereby be applicable also to LBRM.

In some embodiments, $R_{init}$ denotes the code rate after applying LBRM (if applied). $R_{init}$ is the effective code rate at initial transmission of the transport block. An effective code rate is the code rate used in running the LDPC encoder and decoder, after taking into account various factors that determine effective code rate. Such factors include at least: (a) the nominal code rate, as signaled in a control information to schedule the transmission of the transport block; and (b) limited buffer rate matching. $R_{init}$ applies to both uplink transport block transmission, and downlink transport block transmission.

For initial transmissions with code rate $R_{init}$>¼ for example (particular embodiments may choose a different rate), BG2 is not used when TBS>3824. In particular embodiments, the previous rule only applies if the UE supports BG1 (i.e., if the UE does not support BG1, then do not apply the rule). BG2 is used for initial transmissions with code rate $R_{init}$<=¼ for example, for all TBS supported at that code rate For BG2 with TBSs larger than 3824, the TB is segmented into CBs no larger than 3840.

Figure 7:
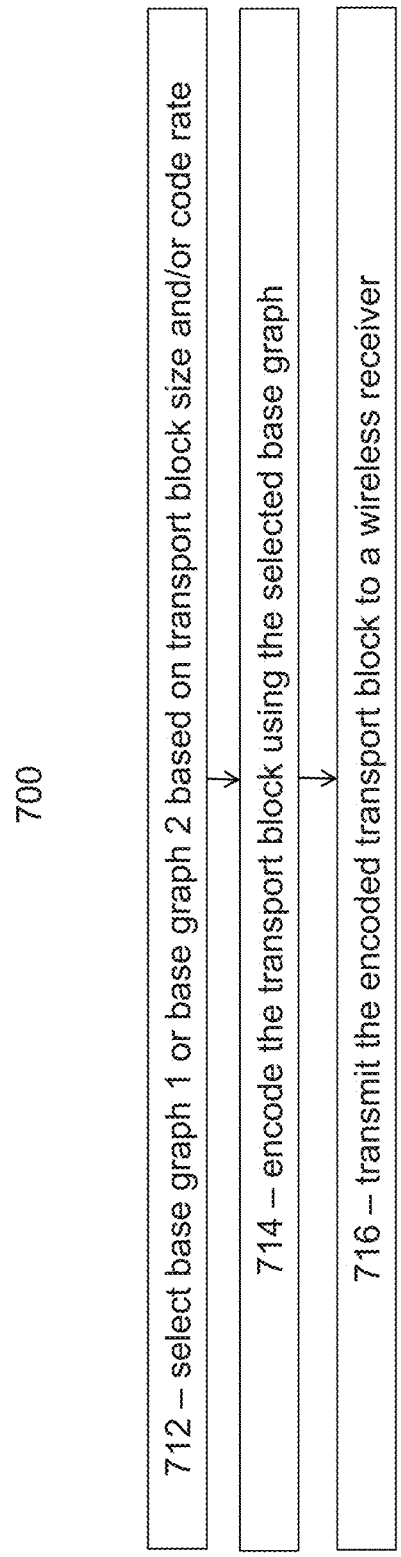
FIG. 7 is a flow diagram illustrating an example method in a wireless transmitter.

FIG. 7 is a flow diagram illustrating an example method in a wireless transmitter, according to particular embodiments. In particular embodiments, one or more steps of FIG. 7 may be performed by network node 120 or wireless device 110 of network 100 described with respect to FIG. 2.

The method begins at step 712, where the wireless transmitter selects base graph 1 or base graph 2 based on transport block size and/or code rate. For example, network node 120 may determine a code rate for transmitting a transport block is less than or equal to R_threshold (R_threshold is between ⅕ and ⅓) and select NR LDPC base graph 2 for encoding the transport block. Otherwise, network node 120 selects NR LDPC base graph 1 for encoding the transport block, unless a TBS of the transport block is less than or equal to a size threshold (X) and a code rate for transmitting the transport block is less than or equal to ⅔, in which case network node 120 may select base graph 2. In some embodiments the wireless transmitter may select a base graph based on the flowchart illustrated in FIG. 6.

In particular embodiments, R_threshold is ¼. The size threshold X may be 3824 bits, or when the TBS includes parity check bits the size threshold X may be 3840 bits. The TBS and code rate for the transport block may be determined based on MCS and a TBS index associated with the transport block. The wireless transmitter may adjust the code rate based on whether the wireless receiver uses LBRM.

At step 714, the wireless transmitter encodes the transport block using the selected base graph. For example, network node 120 may LDPC encode the transport block using either base graph 1 or base graph 2.

At step 716, the wireless transmitter transmits the encoded transport block to a wireless receiver. For example, network node 120 may transmit the LDPC encoded transport block to wireless device 110.

Modifications, additions, or omissions may be made to method 700 of FIG. 7. Additionally, one or more steps in the method of FIG. 7 may be performed in parallel or in any suitable order. The steps may be repeated over time as necessary. Although network node 120 is used as an example wireless transmitter and wireless device 110 is used as an example wireless receiver in the above examples, in other examples wireless device 110 may be the wireless transmitter and network node 120 may be the wireless receiver.

Figure 8:
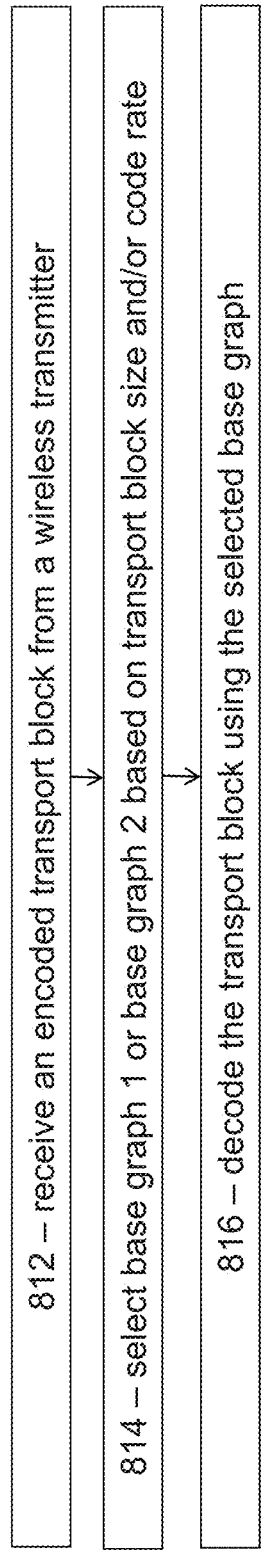
FIG. 8 is a flow diagram illustrating an example method in a wireless receiver.

FIG. 8 is a flow diagram illustrating an example method in a wireless receiver, according to particular embodiments. In particular embodiments, one or more steps of FIG. 8 may be performed by network node 120 or wireless device 110 of network 100 described with respect to FIG. 2.

The method begins at step 812, where the wireless receiver receives an encoded transport block from a wireless transmitter. For example, wireless device 110 may receive an LDPC encoded transport block from network node 120. The transport block may be encoded according to method 700 described with respect to FIG. 7.

At step 814, the wireless receiver selects base graph 1 or base graph 2 based on transport block size and/or code rate. For example, wireless device 110 may determine a code rate for receiving a transport block is less than or equal to R_threshold (R_threshold is between ⅕ and ⅓) and select NR LDPC base graph 2 for decoding the transport block. Otherwise, wireless device 110 selects NR LDPC base graph 1 for decoding the transport block, unless a TBS of the transport block is less than or equal to a size threshold (X) and a code rate for receiving the transport block is less than or equal to ⅔, in which case wireless device 110 may select base graph 2. In some embodiments the wireless receiver may select a base graph based on the flowchart illustrated in FIG. 6.

In particular embodiments, R_threshold is ¼. The size threshold X may be 3824 bits, or when the TBS includes parity check bits the size threshold X may be 3840 bits. The TBS and code rate for the transport block may be determined based on MCS and a TBS index associated with the transport block. The wireless receiver may adjust the code rate based on whether the wireless receiver uses LBRM.

At step 816, the wireless receiver decodes the transport block using the selected base graph. For example, wireless device 110 may LDPC decode the transport block using either base graph 1 or base graph 2.

Modifications, additions, or omissions may be made to method 800 of FIG. 8. Additionally, one or more steps in the method of FIG. 8 may be performed in parallel or in any suitable order. The steps may be repeated over time as necessary. Although network node 120 is used as an example wireless transmitter and wireless device 110 is used as an example wireless receiver in the above examples, in other examples wireless device 110 may be the wireless transmitter and network node 120 may be the wireless receiver.

Figure 9B:
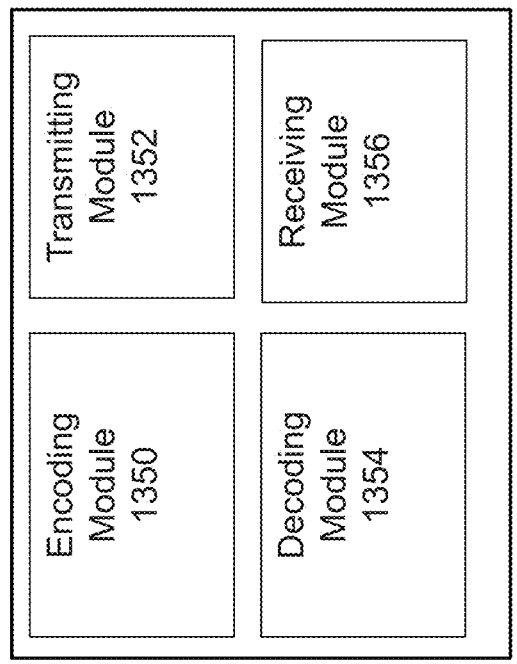
FIG. 9B is a block diagram illustrating example components of a wireless device.
Figure 9A:
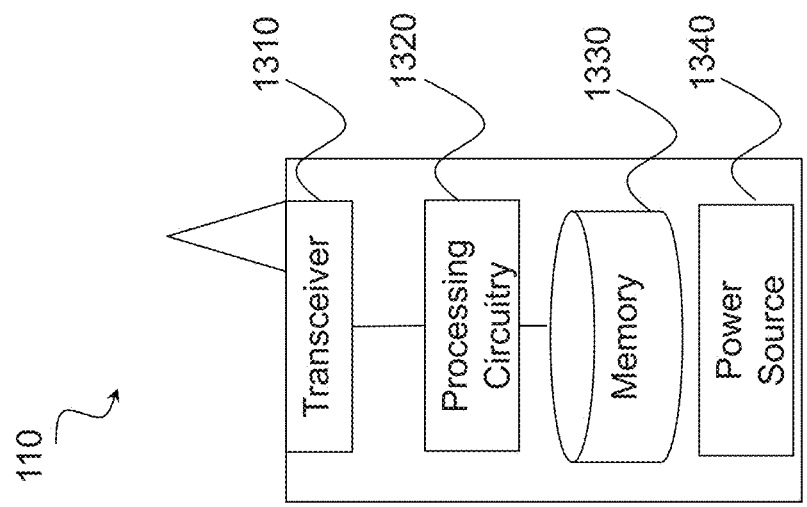
FIG. 9A is a block diagram illustrating an example embodiment of a wireless device.

FIG. 9A is a block diagram illustrating an example embodiment of a wireless device. The wireless device is an example of the wireless devices 110 illustrated in FIG. 2. In particular embodiments, the wireless device is capable of selecting one of two base graphs for encoding or decoding wireless signals.

Particular examples of a wireless device include a mobile phone, a smart phone, a PDA (Personal Digital Assistant), a portable computer (e.g., laptop, tablet), a sensor, a modem, a machine type communication (MTC) device/machine to machine (M2M) device, laptop embedded equipment (LEE), laptop mounted equipment (LME), USB dongles, a device-to-device capable device, a vehicle-to-vehicle device, or any other device that can provide wireless communication. The wireless device includes transceiver 1310, processing circuitry 1320, memory 1330, and power source 1340. In some embodiments, transceiver 1310 facilitates transmitting wireless signals to and receiving wireless signals from wireless network node 120 (e.g., via an antenna), processing circuitry 1320 executes instructions to provide some or all of the functionality described herein as provided by the wireless device, and memory 1330 stores the instructions executed by processing circuitry 1320. Power source 1340 supplies electrical power to one or more of the components of wireless device 110, such as transceiver 1310, processing circuitry 1320, and/or memory 1330.

Processing circuitry 1320 includes any suitable combination of hardware and software implemented in one or more integrated circuits or modules to execute instructions and manipulate data to perform some or all of the described functions of the wireless device. In some embodiments, processing circuitry 1320 may include, for example, one or more computers, one more programmable logic devices, one or more central processing units (CPUs), one or more microprocessors, one or more applications, and/or other logic, and/or any suitable combination of the preceding. Processing circuitry 1320 may include analog and/or digital circuitry configured to perform some or all of the described functions of wireless device 110. For example, processing circuitry 1320 may include resistors, capacitors, inductors, transistors, diodes, and/or any other suitable circuit components.

Memory 1330 is generally operable to store computer executable code and data. Examples of memory 1330 include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or or any other volatile or non-volatile, non-transitory computer-readable and/or computer-executable memory devices that store information.

Power source 1340 is generally operable to supply electrical power to the components of wireless device 110. Power source 1340 may include any suitable type of battery, such as lithium-ion, lithium-air, lithium polymer, nickel cadmium, nickel metal hydride, or any other suitable type of battery for supplying power to a wireless device.

Other embodiments of the wireless device may include additional components (beyond those shown in FIG. 9A) responsible for providing certain aspects of the wireless device's functionality, including any of the functionality described above and/or any additional functionality (including any functionality necessary to support the solution described above).

FIG. 9B is a block diagram illustrating example components of a wireless device 110. The components may include encoding module 1350, transmitting module 1352, decoding module 1354, and receiving module 1356.

Encoding module 1350 may perform the encoding functions of wireless device 110. For example, encoding module 1350 may encode a transport block using one of two possible base graphs according to any of the examples and embodiments described above. In certain embodiments, encoding module 1350 may include or be included in processing circuitry 1320. In particular embodiments, encoding module 1350 may communicate with transmitting module 1352.

Transmitting module 1352 may perform the transmitting functions of wireless device 110. For example, transmitting module 1352 may transmit a transport block to a network node. In certain embodiments, transmitting module 1352 may include or be included in processing circuitry 1320. In particular embodiments, transmitting module 1352 may communicate with encoding module 1350.

Decoding module 1354 may perform the decoding functions of wireless device 110. For example, decoding module 1354 may decode a transport block using one of two possible base graphs according to any of the examples and embodiments described above. In certain embodiments, decoding module 1354 may include or be included in processing circuitry 1320. In particular embodiments, decoding module 1354 may communicate with receiving module 1356.

Receiving module 1356 may perform the receiving functions of wireless device 110. For example, receiving module 1356 may receive a transport block from a network node. In certain embodiments, receiving module 1356 may include or be included in processing circuitry 1320. In particular embodiments, receiving module 1356 may communicate with decoding module 1354.

Figure 10B:
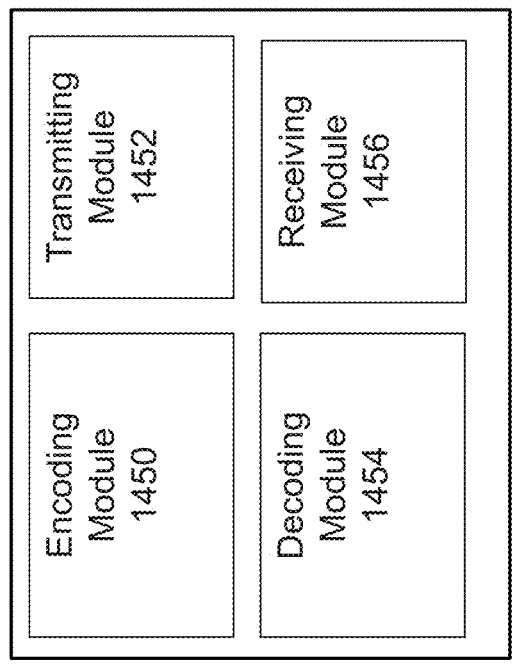
FIG. 10B is a block diagram illustrating example components of a network node.
Figure 10A:
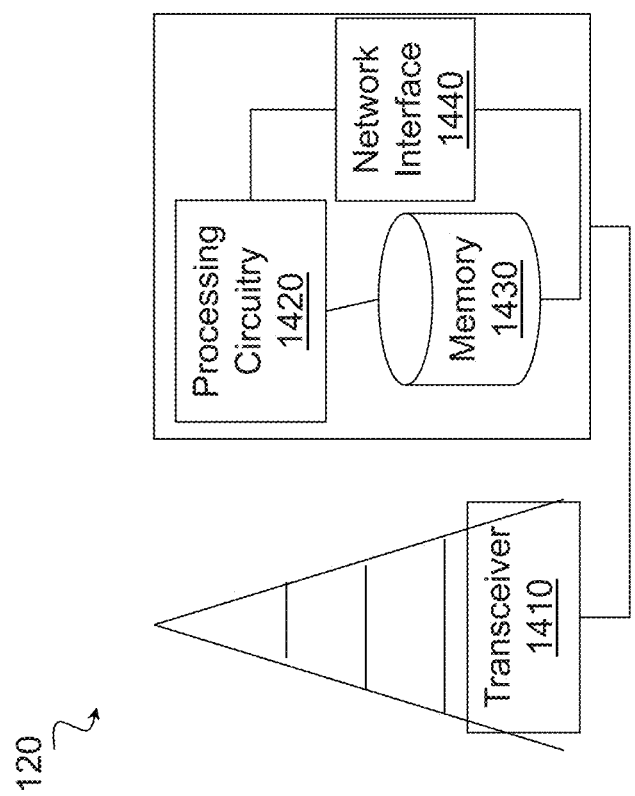
FIG. 10A is a block diagram illustrating an example embodiment of a network node.

FIG. 10A is a block diagram illustrating an example embodiment of a network node. The network node is an example of the network node 120 illustrated in FIG. 2. In particular embodiments, the network node is capable of selecting one of two base graphs for encoding or decoding wireless signals.

Network node 120 can be an eNodeB, a nodeB, a gNB, a base station, a wireless access point (e.g., a Wi-Fi access point), a low power node, a base transceiver station (BTS), a transmission point or node, a remote RF unit (RRU), a remote radio head (RRH), or other radio access node. The network node includes at least one transceiver 1410, at least one processing circuitry 1420, at least one memory 1430, and at least one network interface 1440. Transceiver 1410 facilitates transmitting wireless signals to and receiving wireless signals from a wireless device, such as wireless devices 110 (e.g., via an antenna); processing circuitry 1420 executes instructions to provide some or all of the functionality described above as being provided by a network node 120; memory 1430 stores the instructions executed by processing circuitry 1420; and network interface 1440 communicates signals to backend network components, such as a gateway, switch, router, Internet, Public Switched Telephone Network (PSTN), controller, and/or other network nodes 120. Processing circuitry 1420 and memory 1430 can be of the same types as described with respect to processing circuitry 1320 and memory 1330 of FIG. 9A above.

In some embodiments, network interface 1440 is communicatively coupled to processing circuitry 1420 and refers to any suitable device operable to receive input for network node 120, send output from network node 120, perform suitable processing of the input or output or both, communicate to other devices, or any combination of the preceding. Network interface 1440 includes appropriate hardware (e.g., port, modem, network interface card, etc.) and software, including protocol conversion and data processing capabilities, to communicate through a network.

FIG. 10B is a block diagram illustrating example components of a network node 120. The components may include encoding module 1450, transmitting module 1452, decoding module 1454, and receiving module 1456.

Encoding module 1450 may perform the encoding functions of network node 120. For example, encoding module 1450 may encode a transport block using one of two possible base graphs according to any of the examples and embodiments described above. In certain embodiments, encoding module 1450 may include or be included in processing circuitry 1420. In particular embodiments, encoding module 1450 may communicate with transmitting module 1452.

Transmitting module 1452 may perform the transmitting functions of network node 120. For example, transmitting module 1452 may transmit a transport block to a wireless device. In certain embodiments, transmitting module 1452 may include or be included in processing circuitry 1420. In particular embodiments, transmitting module 1452 may communicate with encoding module 1450.

Decoding module 1454 may perform the decoding functions of network node 120. For example, decoding module 1454 may decode a transport block using one of two possible base graphs according to any of the examples and embodiments described above. In certain embodiments, decoding module 1454 may include or be included in processing circuitry 1420. In particular embodiments, decoding module 1454 may communicate with receiving module 1456.

Receiving module 1456 may perform the receiving functions of network node 120. For example, receiving module 1456 may receive a transport block from a wireless device. In certain embodiments, receiving module 1456 may include or be included in processing circuitry 1420. In particular embodiments, receiving module 1456 may communicate with decoding module 1454.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the claims below.

Abbreviations used in the preceding description include:
3GPP Third Generation Partnership Project
BBU Baseband Unit
BG Base Graph
BTS Base Transceiver Station
CB Code Block
CBS Code Block Size
CC Component Carrier
CRC Cyclic Redundancy Check
CQI Channel Quality Information
CSI Channel State Information
D2D Device to Device
DCI Downlink Control Information
DFT Discrete Fourier Transform
DMRS Demodulation Reference Signal
eNB eNodeB
FDD Frequency Division Duplex
FFT Fast Fourier Transform
gNB Next-generation NodeB
LAA Licensed-Assisted Access
LBT Listen-before-talk
LDPC Low-Density Parity Check
LTE Long Term Evolution
LTE-U LTE in Unlicensed Spectrum
M2M Machine to Machine
MCS Modulation and Coding Scheme
MIB Master Information Block
MIMO Multi-Input Multi-Output
MTC Machine Type Communication
NR New Radio
OFDM Orthogonal Frequency Division Multiplexing
PCM Parity Check Matrix
RAN Radio Access Network
RAT Radio Access Technology
RBS Radio Base Station
RNC Radio Network Controller
RRC Radio Resource Control
RRH Remote Radio Head
RRU Remote Radio Unit
SCell Secondary Cell
SI System Information
SIB System Information Block
TB Transport Block
TBS Transport Block Size
TDD Time Division Duplex
TTI Transmission Time Interval
UE User Equipment
UL Uplink
UTRAN Universal Terrestrial Radio Access Network
WAN Wireless Access Network

The invention claimed is:

1. An encoding method in a wireless communication system, the method comprising:
   determining, for one or more code blocks of a transport block, that at least one of a plurality of criteria is met, wherein the plurality of criteria includes a first criteria that a coding rate (R) is less than or equal to ¼ and a second criteria that a transport block size (TBS) is less than or equal to 3824 bits and the R is less than or equal to ⅔;
   encoding the one or more code blocks using low-density parity-check (LDPC) base graph 2, wherein a maximum code block size is 3840 bits; and
   transmitting the transport block.

2. The method of claim 1, further comprising:
   determining that none of the plurality of criteria is met; and
   based on the determining, using LDPC base graph 1.

3. The method of claim 2, wherein for LDPC base graph 1 a maximum code block size is 8448 bits.

4. The method of claim 1, further comprising:
   attaching cyclic redundancy check (CRC) bits to the one or more code blocks.

5. The method of claim 1, wherein the transmitting comprises an initial transmission of the transport block.

6. The method of claim 1, wherein the transmitting comprises a subsequent re-transmission of the transport block.

7. The method of claim 1, further comprising:
   performing rate matching corresponding to the one or more code blocks.

8. A wireless transmitter comprising:
   a non-transitory memory; and
   processing circuitry to execute instructions read from the non-transitory memory to cause the wireless transmitter to perform operations comprising:
      determining, for one or more code blocks of a transport block, that at least one of a plurality of criteria is met, wherein the plurality of criteria includes a first criteria that a coding rate (R) is less than or equal to ¼ and a second criteria that a transport block size (TBS) is less than or equal to 3824 bits and the R is less than or equal to ⅔;
      encoding the one or more code blocks using low-density parity-check (LDPC) base graph 2, wherein a maximum code block size is 3840 bits; and
      transmitting the transport block.

9. The wireless transmitter of claim 8, the operations further comprising:

determining that none of the plurality of criteria is met; and based on the determining, using LDPC base graph 1.

10. The wireless transmitter of claim 9, wherein for LDPC base graph 1 a maximum code block size is 8448 bits.

11. The wireless transmitter of claim 8, the operations further comprising:

attaching cyclic redundancy check (CRC) bits to the one or more code blocks.

12. The wireless transmitter of claim 8, wherein the transmitting comprises an initial transmission of the transport block.

13. The wireless transmitter of claim 8, wherein the transmitting comprises a subsequent re-transmission of the transport block.

14. The wireless transmitter of claim 8, the operations further comprising:

performing rate matching corresponding to the one or more code blocks.

15. A non-transitory computer-readable medium having stored thereon instructions executable by one or more processors to perform operations comprising:

determining, for one or more code blocks of a transport block, that at least one of a plurality of criteria is met, wherein the plurality of criteria includes a first criteria that a coding rate (R) is less than or equal to $\frac{1}{4}$ and a second criteria that a transport block size (TBS) is less than or equal to 3824 bits and the R is less than or equal to $\frac{2}{3}$;

encoding the one or more code blocks using low-density parity-check (LDPC) base graph 2, wherein a maximum code block size is 3840 bits; and transmitting the transport block.

16. The non-transitory computer-readable medium of claim 15, the operations further comprising:

determining that none of the plurality of criteria is met; and based on the determining, using LDPC base graph 1.

17. The non-transitory computer-readable medium of claim 16, wherein for LDPC base graph 1 a maximum code block size is 8448 bits.

18. The non-transitory computer-readable medium of claim 15, the operations further comprising:

attaching cyclic redundancy check (CRC) bits to the one or more code blocks.

19. The non-transitory computer-readable medium of claim 15, wherein the transmitting comprises an initial transmission of the transport block.

20. The non-transitory computer-readable medium of claim 15, wherein the transmitting comprises a subsequent re-transmission of the transport block.

* * * * *